(12) United States Patent
Tsai et al.

(10) Patent No.: US 6,691,876 B2
(45) Date of Patent: Feb. 17, 2004

(54) SEMICONDUCTOR WAFER CASSETTE

(75) Inventors: Yu-Pin Tsai, Kaoshiung (TW); Chih-Min Pao, Kaoshiung (TW); Ching-Feng Tseng, Kaoshiung (TW); Fu-Tang Chu, Kaoshiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 10/056,357

(22) Filed: Jan. 25, 2002

(65) Prior Publication Data
US 2003/0075518 A1 Apr. 24, 2003

(30) Foreign Application Priority Data
Oct. 22, 2001 (TW) ........................................ 90126036 A

(51) Int. Cl.$^7$ ................................................ A47G 19/08
(52) U.S. Cl. ................... 211/41.18; 206/454; 206/711; 118/500
(58) Field of Search ....................... 211/41.18; 206/454, 206/711; 118/500

(56) References Cited

U.S. PATENT DOCUMENTS

| | | | |
|---|---|---|---|
| 3,923,156 A | * 12/1975 | Wallestad | 118/500 |
| 3,961,877 A | * 6/1976 | Johnson | 206/454 |
| 4,160,504 A | * 7/1979 | Kudlich et al. | 206/454 |
| 4,471,716 A | * 9/1984 | Milliren | 118/320 |
| 4,516,812 A | * 5/1985 | Gander et al. | 206/308.3 |
| 4,669,612 A | * 6/1987 | Mortensen | 134/182 |
| 4,687,097 A | * 8/1987 | Mortensen | 206/454 |
| 4,779,732 A | * 10/1988 | Boehm et al. | 206/454 |
| 4,949,848 A | * 8/1990 | Kos | 118/500 |
| 5,025,926 A | * 6/1991 | Gregerson et al. | 206/454 |
| 5,193,682 A | * 3/1993 | Naito et al. | 118/500 |
| 5,476,176 A | * 12/1995 | Gregerson et al. | 141/98 |
| 5,555,981 A | * 9/1996 | Gregerson | 206/454 |
| 5,706,946 A | * 1/1998 | Kakizaki et al. | 206/454 |
| 5,782,362 A | * 7/1998 | Ohori | 206/454 |
| 5,816,410 A | * 10/1998 | Nyseth | 206/587 |

* cited by examiner

Primary Examiner—Daniel P. Stodola
Assistant Examiner—Khoa Tran
(74) Attorney, Agent, or Firm—Ladas & Parry

(57) ABSTRACT

A semiconductor wafer cassette has a first side wall, a second side wall opposite the first side wall, a front surface, and a back surface opposite the front surface. A body defines an internal bay portion with slots for vertically receiving wafers, each slot of the internal bay portion having one support slab. The body also includes two parallel legs for supporting the cassette and a handle for handling the cassette.

6 Claims, 4 Drawing Sheets

SEMICONDUCTOR WAFER CASSETTE

BACKGROUND OF THE INVENTION

1. Field of the Invention

The present invention relates to a semiconductor wafer cassette, in particular, to one comprising support slabs and broadened slots.

2. Description of Related Art

A semiconductor wafer cassette is a typical device for storing, transporting, and processing of the silicon wafers. In general, a semiconductor wafer cassette is designed so as to receive at least one silicon wafer. More specifically, the semiconductor wafer cassette mainly comprises a plurality of slots, and each slot can receive one silicon wafer.

FIG. 1 is a perspective view of a conventional semiconductor wafer cassette. The semiconductor wafer cassette 10 includes a front surface 16, a back surface 17, a left side wall 14, pairs of left dividers 18a and right dividers 18b, and a right side wall 15, wherein the four walls together define an internal bay portion for receiving a plurality of wafers parallel to each other. The semiconductor wafer cassette further includes a pair of parallel legs 22, 23 for supporting the cassette 10, and a handle 13 for facilitating handling of the cassette 10.

FIG. 2 is an elevational view of the semiconductor wafer cassette shown in FIG. 1. Each of the opposite side walls 14 and 15 is provided on the inner surface thereof with a plurality of alignment grooves 19, wherein the alignment grooves and the side walls 14 and 15 together define 25 slots with a width of 6.35 mm, and one silicon wafer can be placed in each slot.

FIG. 3 is a schematic view for illustration of a wafer warp condition within the semiconductor wafer cassette shown in FIG. 1. It is obvious that the wafer placed inside the slot droops at the central part because the whole wafer is only supported by the left dividers 18a and right dividers 18b while the central part is in a suspended state and, under the influence of gravity, the central part droops naturally; the phenomenon becomes more and more evident when the diameter of silicon wafer is greater or when the thickness of the wafer is thinner. Moreover, the wafer warps because of the central droop of the wafer, thus even if the wafer is later taken out from the cassette and put on a workbench, the wafer will be still in a U shape with two sides bending upward. The relationship between the wafer's drooped value in the semiconductor wafer cassette and the wafer's warped value on the workbench is shown in Table 1. The wafer's deformation brings up difficulty in processes such as the precision of loading and unloading of the polishing machine and wafer mounter. In a serious condition, the deformation can even cause the wafer no longer usable, and thus results in the raise of the production cost, low yield, and low productivity.

TABLE 1

| | | | | | |
|---|---|---|---|---|---|
| Wafer's drooped value in the semiconductor wafer cassette | 4 mm | 6 mm | 7 mm | 10 mm | 11 mm |
| Wafer's warped value on the workbench | 1 mm | 2 mm | 3 mm | 4 mm | 5 mm |

Besides, the width of conventional semiconductor wafer cassette is only 6.35 mm; such a small width eventually makes the wafer inside the cassette easy to touch each other and results in mechanical damages due to warping of the wafer. This can also increase the product cost, or sometimes even cause the processing machines to break down, and thus an improvement in this regard is also needed.

SUMMARY OF THE INVENTION

An object of the present invention is to provide a semiconductor wafer cassette which is able to prevent drooping of the wafer inside the cassette.

Another object of the present invention is to provide a semiconductor wafer cassette that can improve wafer's warp to a certain extent.

Still another object of the present invention is to provide a semiconductor wafer cassette which prevents the wafer from contacting each other during transportation so as to avoid wafer damage and processing machine's breakdown.

To achieve the objects above, the present invention discloses a semiconductor wafer cassette, which is able to receive at least one wafer, comprising: a first side wall, a second side wall opposite to the first side wall, a front surface displaced between the first side wall and the second side wall, and a back surface displaced between the first side wall and the second side wall and opposite to the front surface; the cassette further comprising a body defined by the aforementioned four elements, the body defining an internal bay portion with slots constructed by alignment grooves between adjacent dividers on the inner surface of the first side wall and the second side wall and support slabs displaced across two corresponding alignment grooves, wherein each slot can receive one wafer. The support slab extended between the first and the second side walls is used for supporting the wafer inside the semiconductor wafer cassette. Moreover, the body also includes two parallel legs for supporting the cassette and a handle for handling the cassette.

By the construction described above, the semiconductor wafer cassette of the present invention can completely support the wafer inside and has broadened slots. The semiconductor wafer cassette of the present invention not only reduces the drooping phenomenon of wafers placed in the cassette, but also provides wafers a bigger space with broadened slots and thus prevent wafers from damage during loading onto or unloading from processing machines.

BRIEF DESCRIPTION OF THE DRAWINGS

The present invention is described below by way of examples with reference to the accompanying drawings which will make readers easier to understand the purpose, technical contents, characteristics, and achievement of the present invention, wherein.

DETAILED DESCRIPTION OF THE INVENTION

Figure 4:
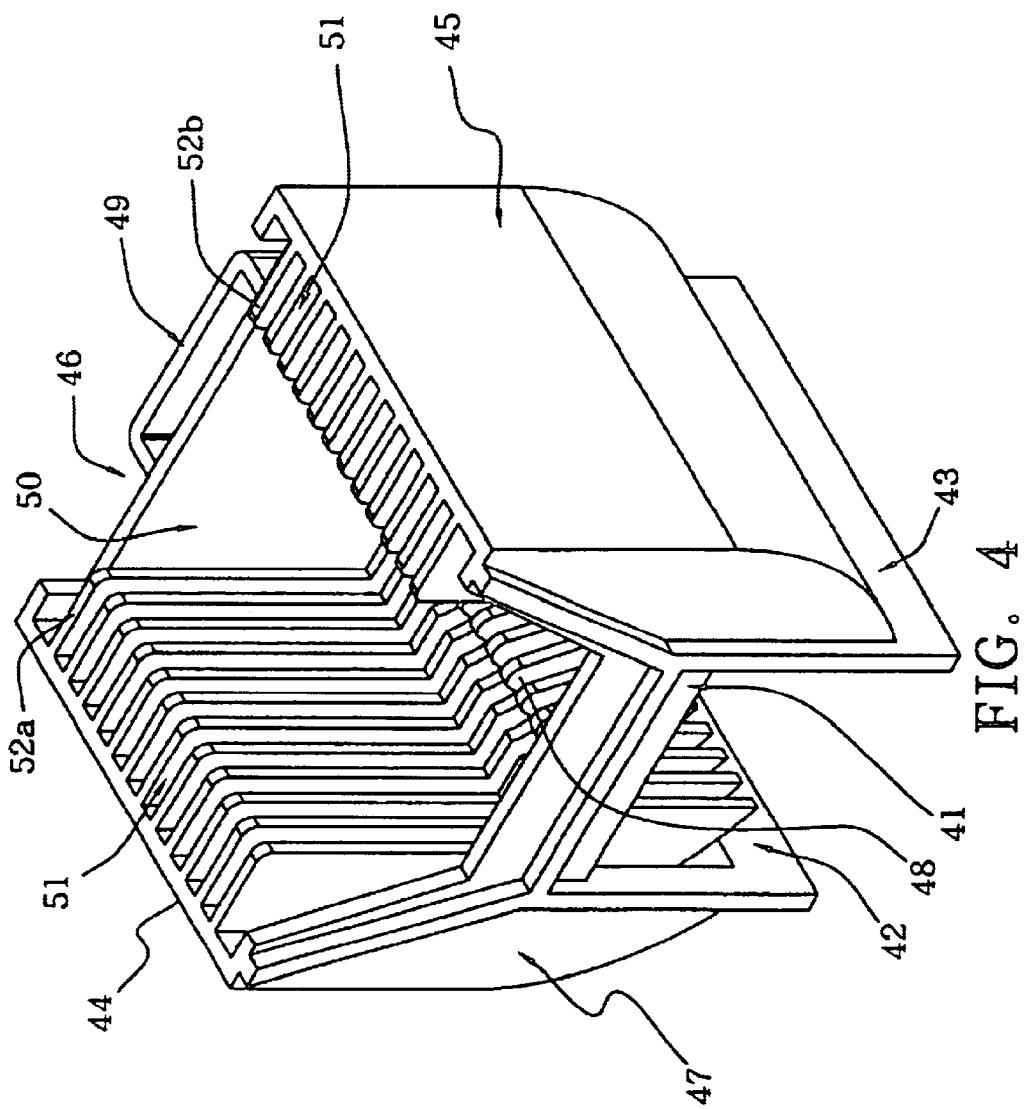
FIG. 4 is a perspective view of a semiconductor wafer cassette of the A present invention.

FIG. 4 shows a semiconductor water cassette of the present invention. The cassette 40 comprises a first side wall 44, a second side wall 45 opposite to the first side wall 44, a front surface 46, and a back surface 47 opposite to the front surface 46. The four elements together define a body 41. The body 41 comprises an internal bay portion 50 which is constructed with a plurality of slots or alignment grooves 51 between adjacent left dividers 52a on the first side wall 44 right dividers 52b on the second side wall 45 and support slabs 48 therebetween. Thus, one wafer can be placed vertically in one slot. The support slabs 48 provides overall support for wafers inside the cassette 40, so droop of the wafer is remarkably reduced. Moreover, the body 41 further includes a pair of parallel legs 42 and 43 for supporting the whole cassette 40 and wafers therein, and a handle 49 on the outside of the front surface 46 for user to hold the cassette 40.

Figure 1:
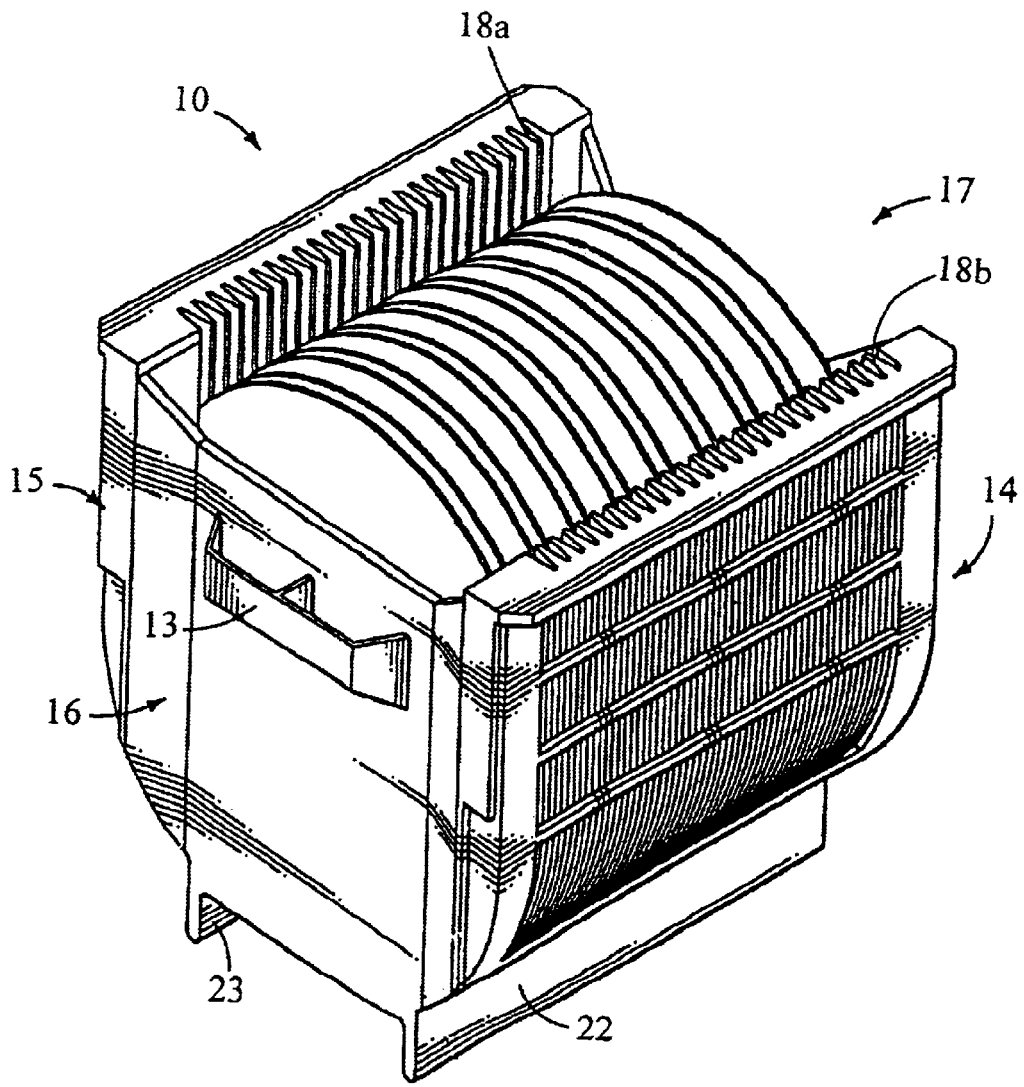
FIG. 1 is a perspective view of a conventional semiconductor wafer cassette.
Figure 2:
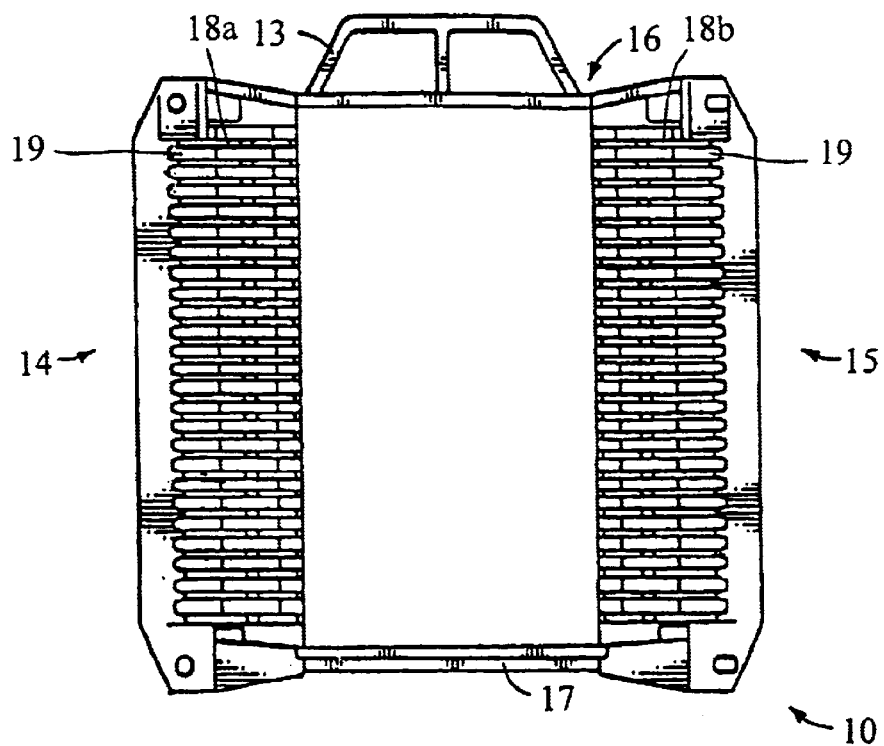
FIG. 2 is an elevational view of the semiconductor wafer cassette shown in FIG. 1.
Figure 3:
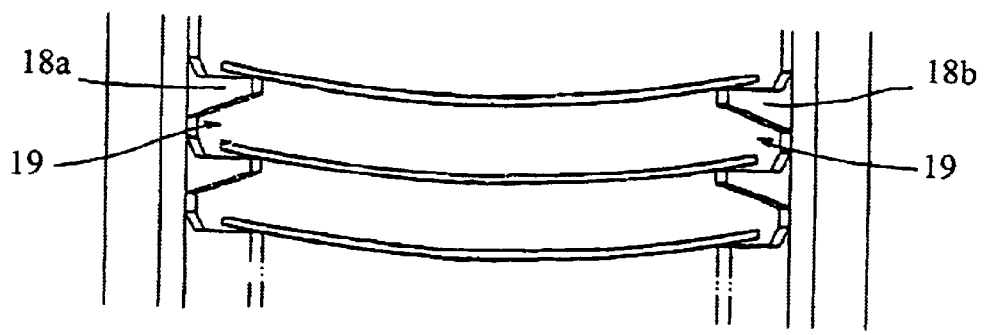
FIG. 3 is a schematic view for illustration of a wafer warp condition within the semiconductor wafer cassette shown in FIG. 1.
Figure 5:
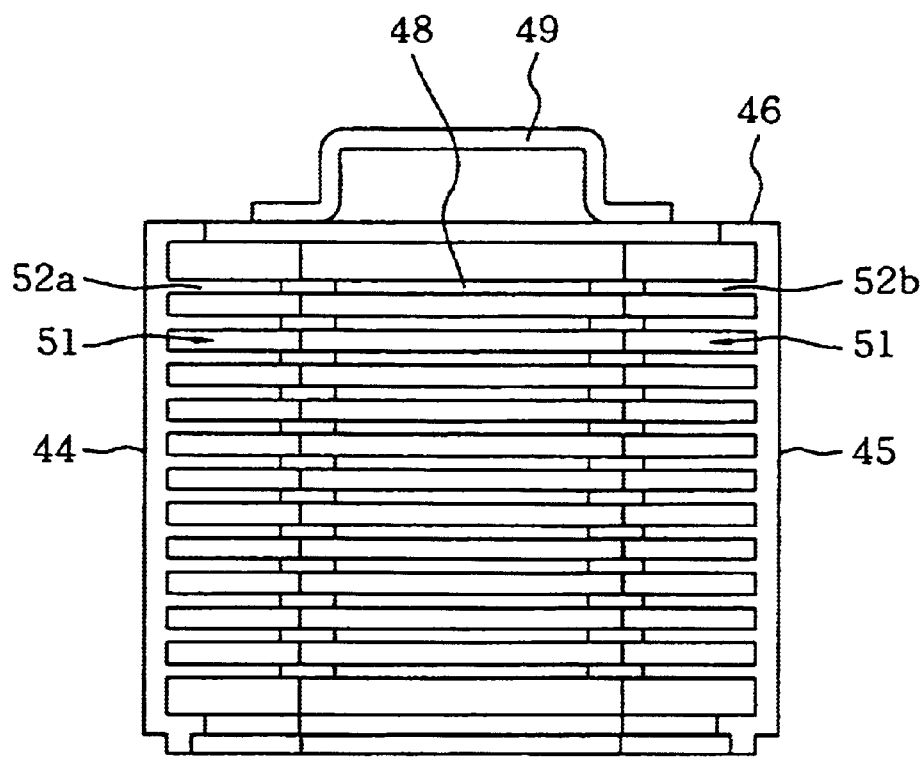
FIG. 5 is an elevational view of the semiconductor wafer cassette shown in FIG. 4.

FIG. 5 is an elevational view of the semiconductor wafer cassette shown in FIG. 4. Each slot of the semiconductor wafer cassette 40 of the present invention is provided with one support slab 48 therein, whereas the conventional cassette 10 shown in FIG. 2 is hollow in-between the alignment grooves; therefore, when the semiconductor wafer cassette 40 is placed vertically as shown in FIG. 5, namely the wafers inside the semiconductor wafer cassette 40 are in a horizontal status, the center of each wafer will not droop and warp due to the gravity. Moreover, the width of the slot of the semiconductor wafer cassette of the present invention is bigger than 7 mm, while a better width is 12.7 mm, which is wider than 6.3 mm of the width of a conventional cassette. Thus even a wafer is slightly warped during processing, there will be no problem placing the warped wafer into the semiconductor wafer cassette or problem of the wafer colliding with the semiconductor wafer cassette and thus causing damage.

Figure 6:
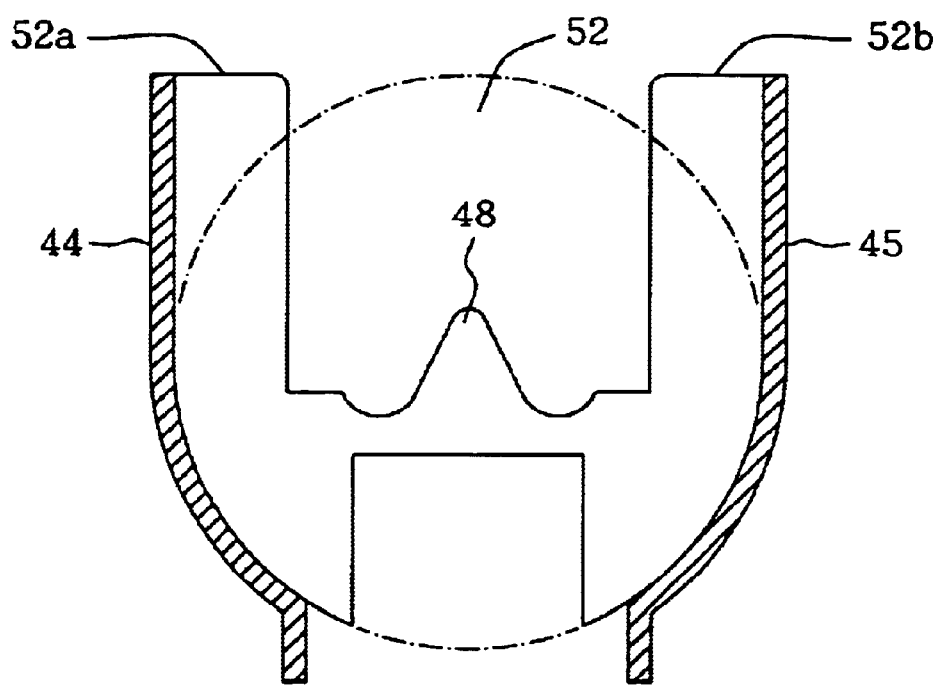
FIG. 6 is a cross-sectional view along line 6—6' of the semiconductor wafer cassette shown in FIG. 4.

FIG. 6 is a cross-sectional view along line 6—6' of the semiconductor wafer cassette shown in FIG. 4. As shown in FIG. 6, the wall of the slot is constructed by alignment grooves 51 on the inner surface of the first side wall 44 and the second side wall 45 and support slab 48 between the alignment grooves 51 and is made integrally, thus the manufacture complexity is reduced. Moreover, because the shape of the wall of the slot is just right to support the rim and the central part of the wafer 52 placed inside the semiconductor wafer cassette, it provides the wafer 52 and a good support and prevents the wafer from warping.

Table 2 shows a comparison between the wafer's droop values in a conventional semiconductor wafer cassette and in the semiconductor wafer cassette of the present invention. Because the semiconductor wafer cassette of the present invention effectively reduces wafer's warp, the wafer's loading and unloading problems in the polishing machine, wafer mounter, and other processing machines no longer exist, and processing machines' breakdown from wafer's break is resolved, thus the whole process becomes smoother.

TABLE 2

| | | | | | |
|---|---|---|---|---|---|
| Wafer's drooped value in a conventional semiconductor wafer cassette | 4 mm | 6 mm | 7 mm | 10 mm | 11 mm |
| Wafer's warped value in a semiconductor wafer cassette of the present invention | <1 mm | <1 mm | <1 mm | <1 mm | <1 mm |

The technical contents and features of the present invention are disclosed above. However, anyone familiar with the technique could possibly make modify or change the details in accordance with the present invention without departing from the technologic ideas and spirit of the invention. The protection scope of the present invention shall not be limited to what embodiment discloses, and should include various modification and changes that are made without departing from the technologic ideas and spirit of the present invention, and should be covered by the claims mentioned below.

What is claimed is:

1. A semiconductor wafer cassette, which is able to receive at least one wafer, comprising:

a first side wall having a plurality of first dividers;

a second side wall opposite to the first side wall and having a plurality of second dividers;

a front surface, connected between the first side wall and the second side wall;

a back surface, connected between the first side wall and the second side wall and opposite to the front side wall; and a body defined by the first side wall, the second side wall, the front surface, and the back surface, including:

an internal bay portion having a plurality of slots constructed by alignment grooves on the inner surface of the first side wall and the second side wall and support slabs displaced across the alignment grooves, wherein the support slabs go from the first dividers to the second dividers to support the central part of the wafer, and each slot is able to receive one wafer;

two legs parallel to each other; and a handle displaced on the front surface for handling the semiconductor wafer cassette.

2. The cassette according to claim 1, wherein the alignment grooves and the support slabs are made integrally.

3. The cassette according to claim 1, wherein the width of the slots is more than 7 mm.

4. The cassette according to claim 3, wherein the width of the slots is 12.7 mm.

5. A semiconductor wafer cassette, which is able to receive at least one wafer, comprising:

a first side wall having a plurality of first dividers;

a second side wall opposite to the first side wall and having a plurality of second dividers;

a front surface, connected between the first side wall and the second side wall;

a back surface, connected between the first side wall and the second side wall and opposite to the front side wall; and a body defined by the first side wall, the second side wall, the front surface, and the back surface, including:

an internal bay portion having a plurality of slots constructed by alignment grooves on the inner surface of the first side wall and the second side wall and support slabs displaced across the alignment grooves, wherein the support slabs go from the first dividers to the second dividers to support the central part of the wafer, and the width of each slot is greater than 7 mm;

two legs parallel to each other; and a handle displaced on the front surface for handling the semiconductor wafer cassette.

6. The cassette according to claim 5, wherein the width of the slots is 12.7 mm.

* * * * *